United States Patent [19]

Yu et al.

[11] Patent Number: 5,314,843
[45] Date of Patent: May 24, 1994

[54] INTEGRATED CIRCUIT POLISHING METHOD

[75] Inventors: Chris C. Yu; Gurtej S. Sandhu; Trung T. Doan, all of Boise, Id.

[73] Assignee: Micron Technology, Inc., Boise, Id.

[21] Appl. No.: 858,670

[22] Filed: Mar. 27, 1992

[51] Int. Cl.$^5$ .......................................... H01L 21/302
[52] U.S. Cl. ................................... 437/225; 437/974; 156/636
[58] Field of Search .......... 156/636; 51/281 R, 283 R; 437/225, 228, 974

[56] References Cited

U.S. PATENT DOCUMENTS

| | | | |
|---|---|---|---|
| 4,735,679 | 4/1988 | Lasky | 156/636 |
| 4,839,311 | 6/1989 | Riley et al. | 437/241 |
| 4,847,111 | 7/1989 | Chow et al. | 437/41 |
| 4,956,313 | 9/1990 | Cote et al. | 156/636 |
| 4,992,135 | 2/1991 | Doan | 156/636 |
| 5,064,777 | 11/1991 | Dhong et al. | 437/233 |
| 5,169,491 | 12/1992 | Doan | 156/636 |

FOREIGN PATENT DOCUMENTS 253706  1/1988  Fed. Rep. of Germany ...... 156/636

OTHER PUBLICATIONS

R. S. Bennett et al., "Selective Planarization Process and Structures," IBM Tech. Disc. Bull., vol. 27, No. 4B, Sep. 1984, pp. 2560-2563.
G. H. Schwuttke et al., "New Gettering Process Using Laser-Induced Damage...," IBM Technical Disclosure Bulletin, vol. 26, No. 1, Jun. 1983, p. 245.
W. L. C. M. Heyboer et al., "Chemomechanical Silicon Polishing", J. Electrochem. Society, vol. 138, No. 3, Mar. 1991, pp. 774-777.
"Enhanced Metal Polish: Corrosion Control by Temperature Friction..." International Technology Disclosures, vol. 9, No. 8, Aug. 25, 1991.
G. S. Oehrlein et al., "Competitive Reactions of Fluorine and Oxygen with W, WSi, and Si Surfaces..." J. Vac. Sci. Tech A, vol. 7, No. 3, May/Jun. 1989, pp. 1035-1041.

Primary Examiner—Tom Thomas
Assistant Examiner—Michael Trinh
Attorney, Agent, or Firm—Dorr, Carson, Sloan & Peterson

[57] ABSTRACT

A semiconductor wafer has a surface layer to be planarized in a chemical mechanical polishing (CMP) process. An area of the layer that is higher than another area is altered so that the removal rate is higher. For example, if the surface layer is TEOS oxide, the higher layer may be bombarded with boron and phosphorus to produce BPSG, which has a polishing rate 2-3 times that of the TEOS. Upon CMP planarization, the higher area erodes faster resulting in improved planarization. Alternatively, the lower area may be doped with nitrogen to produce a nitride which is more resistant to CMP, with the same result. Likewise areas, such as tungsten troughs, which tend to be dished by CMP, may be changed to WNx which is more resistant to the tungsten CMP than the adjacent tungsten, eliminating the dishing upon planarization.

23 Claims, 4 Drawing Sheets

INTEGRATED CIRCUIT POLISHING METHOD

BACKGROUND OF THE INVENTION

1. Field of the Invention

The invention in general relates to the fabrication of integrated circuits, and more particularly to structures and methods for improving the polishing steps in the fabrication of integrated circuits.

2. Statement of the Problem

As is well-known, integrated circuits are generally mass produced by fabricating hundreds of identical circuit patterns on a single semiconducting wafer which is subsequently sawed into hundreds of identical dies or chips. While sometimes referred to as "semiconductor devices", integrated circuits are in fact fabricated from various materials which are either electrically conductive, electrically non-conductive, or electrically semi-conductive. Silicon, the most commonly used semiconductor material, can be used in either the single crystal or polycrystalline form. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as P-type silicon. If the doping is with an element such as phosphorus which has one more valence electron than silicon, additional electrons become the dominant charge carriers and the doped silicon is referred to as N-type silicon. Silicon dioxide is also commonly used in integrated circuits as an insulator or dielectric. Its use is so common that in the art is generally referred to as "oxide" without ambiguity.

As indicated above, the properties of silicon are routinely adjusted in integrated circuit technology by adding dopants. Likewise it is common practice to modify other materials, such as conductors or insulators, by adding other components. Or, one material, such as silicon, may be removed or replaced by another. Processes that commonly are used to modify, remove, or deposit a material are ion implantation, sputtering, etching, chemical vapor deposition (CVD) and variations thereof, such as plasma enhanced chemical vapor deposition (PECVD).

The above-discussed processes are often selectively applied to an integrated circuit through the use of a masking process. In a masking process, a photo mask containing the pattern of the structure to be fabricated is created, the wafer is coated with a light-sensitive material called photoresist or resist, the resist-coated wafer is exposed to ultraviolet light through the mask to soften or harden parts of the resist depending on whether positive or negative resist is used, the softened parts of the resist are removed, the wafer is treated by one of the processes discussed above to modify, remove, or replace the part unprotected by the resist, and then the remaining resist is stripped. This masking process permits specific areas of the integrated circuit to be modified, removed or replaced.

Another process commonly used in fabrication of integrated circuits is chemical mechanical polishing (CMP). This process involves chemically etching of a surface while also mechanically grinding or polishing it. The combined action of surface chemical reaction and mechanical polishing allows for a controlled, layer by layer removal of a desired material from the wafer surface, resulting in a preferential removal of protruding surface topography and a planarized wafer surface. CMP is generally accomplished by polishing the wafer front surface against a polishing pad wetted with a slurry comprised of three ingredients: an acidic or basic solvent; an abrasive; and a suspension fluid. The CMP process is generally used to remove undesirable residues remaining from other processes, particularly when it is also desirable to create a smooth, planar surface for a subsequent process. In the past few years, CMP has become one of the most effective techniques for planarizing all or a portion of a semiconductor wafer. However, while a good local planarization can be readily achieved in a CMP process, obtaining a complete planarization with good uniformity on the scale of a wafer, or even a die, is not easy. On the wafer scale, the polishing rate often is not uniform from wafer center to edge due to a difference in relative speed between the polishing platen and the wafer carrier at wafer center and edge. On the die scale, planarization is also not easy due to height differences in the oxide layer between different regions on the die, for example between a memory array and the periphery area in a die. On a smaller scale, planarization is difficult because of differences in the height of the oxide layer between, for example, N-well regions and P-well regions. As another example, the material removal rate will vary from place to place on the wafer, depending on the wafer structure and composition. For example, the polishing rate at a wafer trough often differs from that at the other parts of the wafer due to the different slurry distribution and flow at the different areas. These differences are particularly acute in stacked capacitor DRAMs. This lack of homogeneous planarization can result in some material not being removed to a desired final thickness that was intended, i.e under polishing, in some material being removed that it was not intended to remove, i.e. over polishing, or both. Further, since the subsequent processes assume or even require a planar wafer surface, this lack of planarization can alter the properties and parameters of the device. All of these results contribute to defective devices, loss of device yield, and lack of device reliability. Thus there is a need for apparatus and methods to improve the uniformity of planarization in the CMP process.

Since semiconductor devices are becoming more complex in structure and materials, and since the CMP planarization process is dependent on structure and materials, apparatus and techniques that permit the fabrication engineer to control and design the CMP process would be highly desirable.

Generally, a change in one phase of the integrated fabrication process usually impacts other phases. Since integrated circuit fabrication processes are highly complex and require sophisticated equipment, developments of entirely new processes and materials can be quite costly. Thus new apparatus and methods for control of the CMP process that can be incorporated into current fabrication technology would be highly desirable because expensive modification of equipment and processes can be avoided.

3. Solution to the problem

The present invention solves the above problems by providing an integrated fabrication method in which, prior to the CMP process, a portion of the wafer surface is modified in selected areas so that the polishing rate in these areas is altered. For example, areas that tend to be dished after the conventional CMP process, may be modified in a plasma nitridation process to create a material more resistant to polishing, thereby decreasing the polishing rate, with the net result that after the CMP process the dishing is eliminated. Or an area where there are large height differences in a surface to be planarized, the higher area is modified in an ion implantation process to create a material less resistant to polishing, thereby increasing the polishing rate, with the net result that after the CMP process, the overall surface is flat with the height differences eliminated.

SUMMARY OF THE INVENTION

The invention provides a method of fabrication of an integrated circuit, the method comprising the steps of: providing a semiconductor wafer having a surface layer of a material to be planarized in a chemical mechanical polishing process; altering a first portion of the surface layer of material to respond differently to the chemical mechanical polishing process than a second portion of the surface layer; and polishing the surface layer in a chemical mechanical polishing process. Preferably, the step of altering comprises adding an impurity to the material. Alternatively, the step of altering comprises chemically altering the first portion of material. Both above approaches are intended to modify the wafer surface in the selected areas so that the polishing rate in these areas can be altered.

In another aspect the invention provides a method of fabrication of an integrated circuit, the method comprising the steps of: providing a semiconductor wafer having a surface layer of a first material to be planarized in a chemical mechanical polishing process; altering a portion of the surface layer of material to create a second material which responds differently to the chemical mechanical polishing process than the first material; and polishing the surface layer in a chemical mechanical polishing process. Preferably, the step of polishing comprises removing all of the second material. Preferably, the step of altering comprises doping selected portions of the first material. In one embodiment, the first material is silicon dioxide, the step of doping comprises doping with boron or phosphorous and the second material is doped silicon oxide. Alternatively, the step of doping comprises doping with nitrogen. In another embodiment, the first material is tungsten, the modification process comprises nitridation in a nitrogen (N) or ammonia (NH$_3$) plasma, and the second material is tungsten nitride.

In a further aspect, the invention provides a method of fabrication of an integrated circuit, the method comprising the steps of: providing a semiconductor wafer having a surface layer of a first material to be planarized in a chemical mechanical polishing process; altering a portion of the surface layer of material above a wafer trough to create a second material more resistant to the chemical mechanical polishing process than the first material; and polishing the surface layer in a chemical mechanical polishing process until all of the second material is removed and the first material is planarized.

In yet another aspect, the invention provides a method of fabrication of an integrated circuit comprising the steps of: providing a semiconductor wafer having a surface layer of a first material to be planarized in a chemical mechanical polishing process; altering a portion of the surface layer of material at either side of a trough to create a second material less resistant to the chemical mechanical polishing process than the first material; and polishing the surface layer in a chemical mechanical polishing process until all of the second material is removed and the first material is planarized.

The invention not only provides a solution to the planarization problems in CMP, but offers a way to do so with standard semiconductor and CMP technology. Numerous other features, objects and advantages of the invention will be apparent from the following description when read together with the accompanying drawings.

DESCRIPTION OF THE PREFERRED EMBODIMENT

1. Overview

Figure 1:
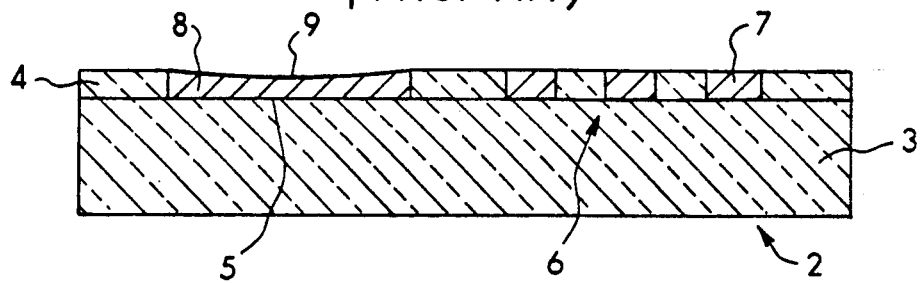
FIG. 1 is a cross-sectional view of a portion of a prior art semiconductor device wafer to which CMP has been applied.
Figure 2:
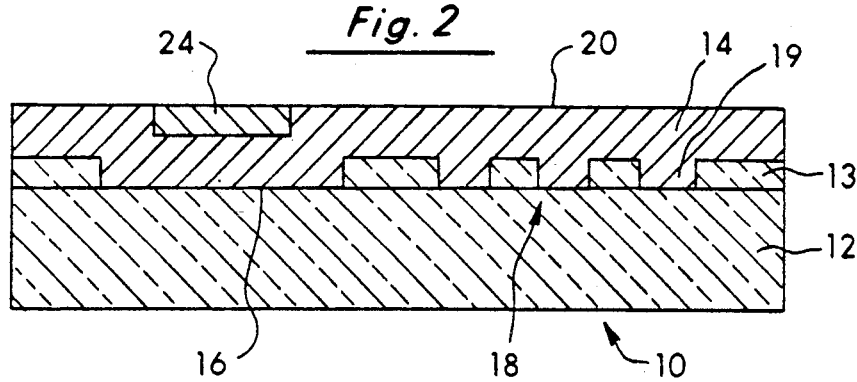
FIG. 2 is a cross-sectional view of the portion of the semiconductor device wafer according to the invention after a portion of the surface layer has been altered to make it more resistant to CMP.

Turning now to FIG. 1, there is shown a cross-sectional view of a portion of a semiconductor wafer 2 according to the prior art. It should be understood that the figures are not meant to be actual cross-sectional views of any particular portion of an actual semiconducting device, but are merely idealized representations which are employed to more clearly and fully depict the process of the invention than would otherwise be possible. Wafer 2 comprises a semiconducting substrate 3 and an oxide layer 4, that has been patterned to form a relatively wide trough 5 and an irregular area 6 with multiple narrow troughs, such as 7. A conducting layer 8 has been deposited on the wafer 2 filling in the troughs 5 and 7. Chemical mechanical polishing (CMP), a well-known planarizing process in the semiconductor fabrication art, has been applied to the surface of conducting layer 8. If the CMP is continued when the interface between metal 8 and substrate oxide 4 is reached, the metal surface above the area 5 will continue to be polished due to the elasticity of the pad. This results in dishing of the surface 9 above the trough area 5. The dishing is far less in areas such as the area above the small trough area 6 because the pad is relatively flat above the small metal features and the applied pad pressure is mainly concentrated on the oxide 4. Turning now to FIG. 2, there is shown a cross-sectional view of a portion of a semiconductor wafer 10 according to the preferred embodiment of the invention. Wafer 10 comprises a semiconducting substrate rate 12 and an oxide layer 13, that has been patterned to form a relatively wide trough 16 and an irregular area 18 with multiple narrow troughs, such as 19. A conducting layer 14 has been deposited on the wafer 10 filling in the troughs 16 and 19. In the method according to the invention, a portion 24 of the layer 14 is altered to form a material which is more resistant to CMP than the material of the adjacent portions of layer 14. The form and type of alteration is selected to just balance the effect of the dishing, so that when the surface 20 is polished, the removal rate of the material 24 above the trough 16 is slower than the removal rate of the material of layer 14 in the area above the area 18 adjacent the trough 16. The depth of alteration 24 is controlled so that all of the altered material 24 is removed when the desired planarization (FIG. 3) has been achieved.

2. Detailed Description of the Fabrication

Returning now to FIG. 2, semiconductor wafer 10 includes a substrate 12 which is preferably lightly doped P-type single crystal silicon, but may also be polysilicon, N-type silicon, or any other type of conducting or semiconducting material that may be used in a semiconductor device. A conventional pad silicon oxide layer 13 has been formed on the substrate 12. By well-known fabrication processes, the oxide 13 has been patterned to form a relatively wide trough 16 and a series of narrow troughs, such as 19, in the area 18 adjacent trough 16. The structure of the substrate 12 and oxide layer 13 in an actual semiconductor device may be considerably more complex and include various dopings of the substrate 12 which are omitted for clarity. A tungsten layer 14 has been formed on wafer 10 by any conventional process such as chemical vapor deposition. The desired end result of this deposition process is that the troughs 16 and 19 be filled with tungsten 14 up to and no further than the surface 30 of oxide layer 13. However, to be sure that all the troughs 16 and 19 are filled with tungsten 14, the layer 14 includes an excess of tungsten. In the conventional processes of fabrication, after formation of the layer 14 the surface 20 is removed by a chemical mechanical polishing process (CMP) which, for removal of tungsten, comprises mechanically polishing the tungsten in a slurry comprising the combination of two or three ingredients including: 1) a chemical base such as hydrogen peroxide ($H_2O_2$) dissolved in water; 2) an abrasive, such as alumina, silica, or titanium oxide ($TiO_x$ where x equals 1 to 2) ; and 3) an optional fluid, such as ethylene glycol in which the abrasive is suspended. The CMP process tends to continue to polish tungsten when the tungsten and oxide substrate interface is reached in the region over the trough 16 due to the dishing effect discussed in the last section.

Figure 3:
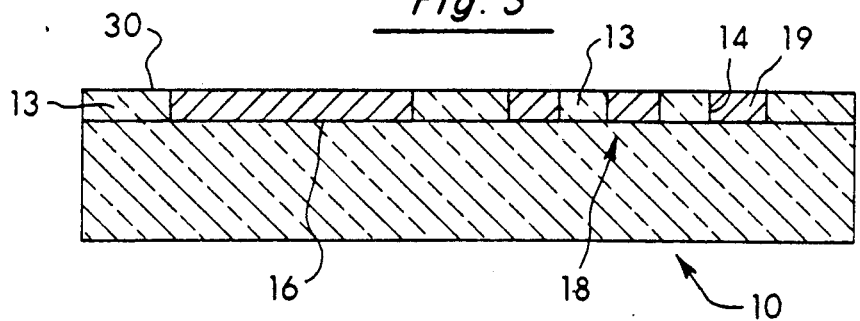
FIG. 3 is a cross-sectional view of the portion of the semiconductor device wafer of FIG. 2 after planarization.

In the process according the invention, a portion 24 of the layer 14 is altered to make it more resistant to the tungsten CMP process, resulting in a slower removal rate in portion 24. Preferably, portion 24 is altered by masking and immersion of the wafer in a nitrogen or ammonia plasma to form tungsten nitride ($WN_x$) or by nitrogen implantation. The masking and nitridation processes are well-known in the semiconductor art, and thus will not be described in detail. The wafer 10 is then planarized by CMP and the result is shown in FIG. 3. The removal rate in the tungsten nitride area 24 has been decreased just enough to result in a thicker tungsten film in the region above trough 16 than that in region above area 18 when the tungsten and oxide interface is reached. So during the continued CMP process to clear metal residue above the oxide 13, the tungsten film in area above trough 16 will become flush with the oxide 13, with no dishing.

Figure 4:
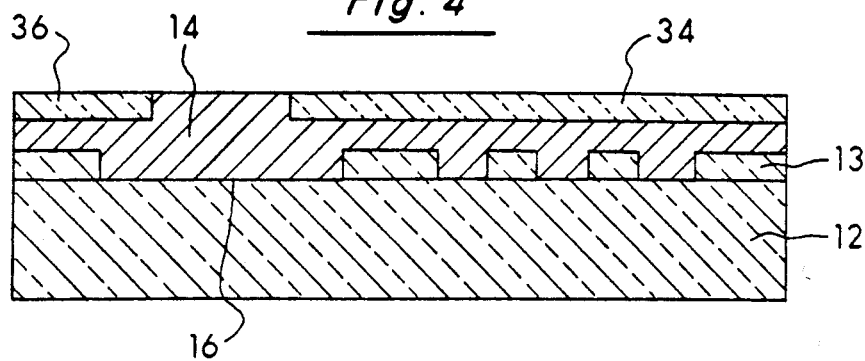
FIG. 4 is a cross-sectional view of a semiconductor wafer according to an alternative preferred embodiment of the invention in which a reverse mask has been used to alter a portion of the wafer surface to make it less resistant to CMP.

FIG. 4 shows an alternative preferred embodiment of the invention to reach the result shown in FIG. 3. In FIG. 4 the wafer of FIG. 1 has been subjected to a masking step and oxidation in a plasma to create tungsten oxide ($WO_x$) regions 34 and 36 adjacent the trough 16. The tungsten oxide regions 34 and 36 are less resistant to tungsten CMP than the undoped tungsten 14. The masking and oxidation is designed so that the removal rate of the portions 34 and 36 of tungsten layer 14 is increased to produce a protruding tungsten profile above area 16 when the tungsten and oxide interface is reached, again with the result that the wafer surface 30 (FIG. 3) is smooth and flat with no dishing. The areas masked to produced the pattern of FIG. 4 is the reverse of the areas masked to produce the doping pattern of FIG. 2, and thus the process of FIG. 4 is called a reverse mask process.

Figure 5:
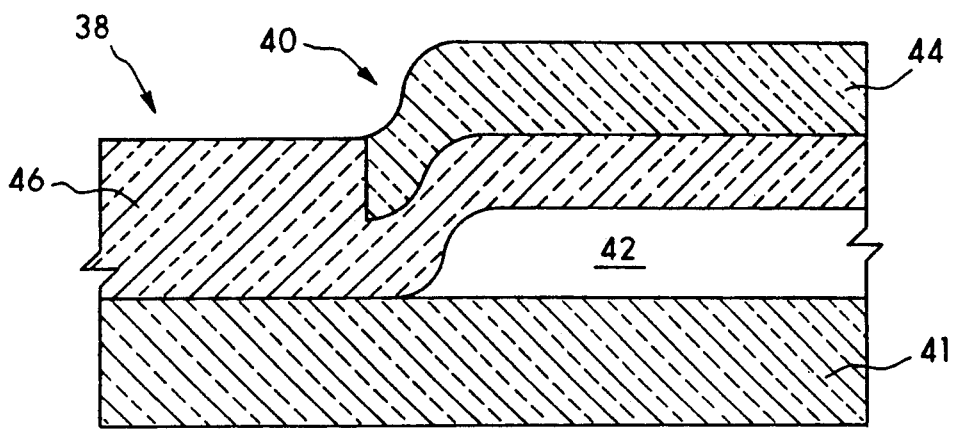
FIG. 5 is a cross-sectional view of a semiconductor wafer according to another alternative preferred embodiment of the invention in which a portion of the oxide layer overlying the periphery of a memory array has been altered to make it less resistant to CMP.

FIG. 5 illustrates another preferred embodiment of the method of the invention. The figure is an idealized depiction of the periphery area 38 adjacent a memory array 40. The array 40 typically comprises a semiconducting substrate 41, multiple layers of semiconducting, conducting, and insulating materials in the area 42, and a boro-phospho-silicate glass (BPSG) silicon oxide layer 44. Both the substrate 41 and the area 42 are generally complex structures involving many different doped areas, the details of which do not play a role in the present invention, and thus are omitted for clarity. The multiple layers in the area 42 raise the memory array 40 significantly above the level of the substrate 41 and thus there is a large height difference between the array 40 and the periphery 38. In the prior art, as one of the final steps of fabrication, the entire wafer is over-laid with the BPSG layer and planarized by a CMP process in which the etch solvent is preferably potassium hydroxide (KOH) diluted in water, the abrasive is silica, and the suspension fluid is ethylene glycol. The large height difference will generally make it difficult to create a smooth, flat surface at the boundary of array 40. In the preferred embodiment of the invention, rather than overlay the entire wafer with BPSG, the entire wafer is overlaid with an undoped silicon dioxide, such as tetraethooxysilane (TEOS) layer 46, the wafer is masked (not shown), and a portion 44 is implanted with boron and phosphorus in an ion implantation process to create the BPSG layer 44. Both the masking and ion implantation are well-known processes in the semiconductor device fabrication art and thus will not be described in detail. The polishing rate of BPSG 44 is much higher that the polishing rate of the undoped oxide 46, thus it will be polished faster and a smooth flat surface 48 (FIG. 6) is easier to obtain in the CMP process. Alternatively, the entire wafer may be overlaid with BPSG as in the prior art, a reverse mask may be used, and nitrogen implanted by ion bombardment in a portion 52 (FIG. 7) of the BPSG layer 50, driving out the boron and phosphorus and replacing them with nitrogen. The resulting silicon nitride 52 has a much slower removal rate in the standard oxide CMP process, and thus a smooth, flat surface similar to that in FIG. 6 may be obtained. It is noted that in this embodiment the nitrogen implantation is designed so that the entire nitride area 52 is removed in the CMP process.

Figure 8:
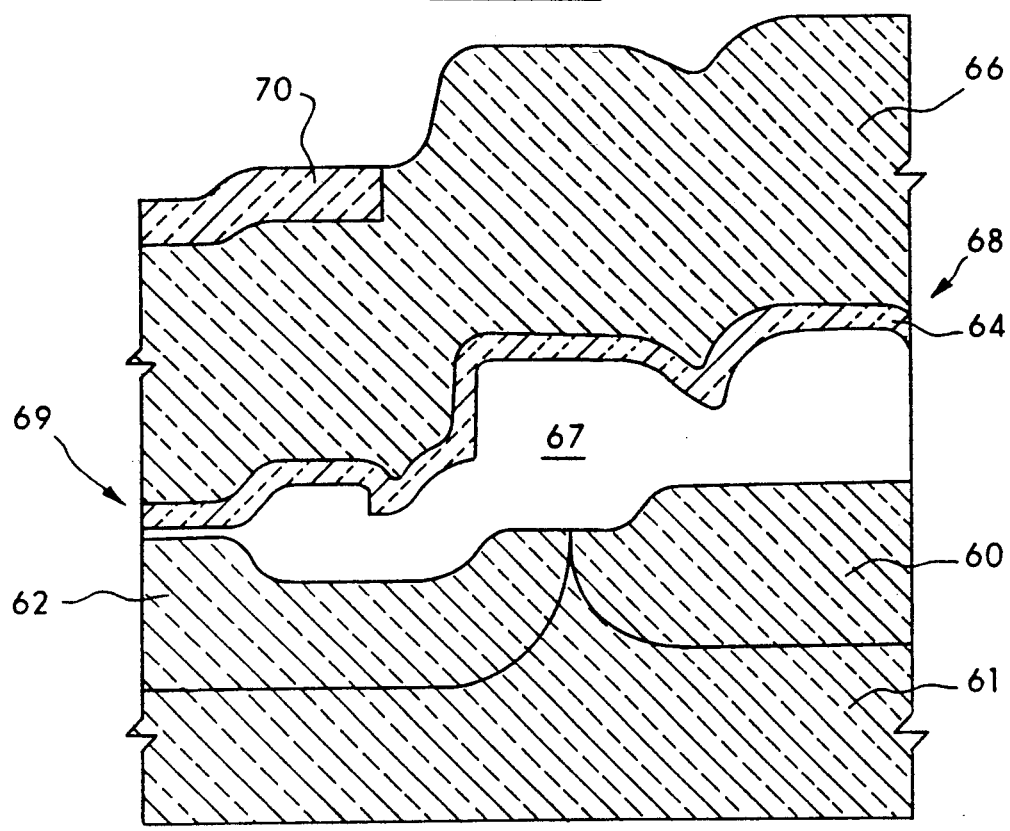
FIG. 8 is a cross-sectional view of a semiconductor wafer according to an additional preferred embodiment of the invention in which a BPSG layer over a N-well region has been altered to yield a slower polishing rate.
Figure 9:
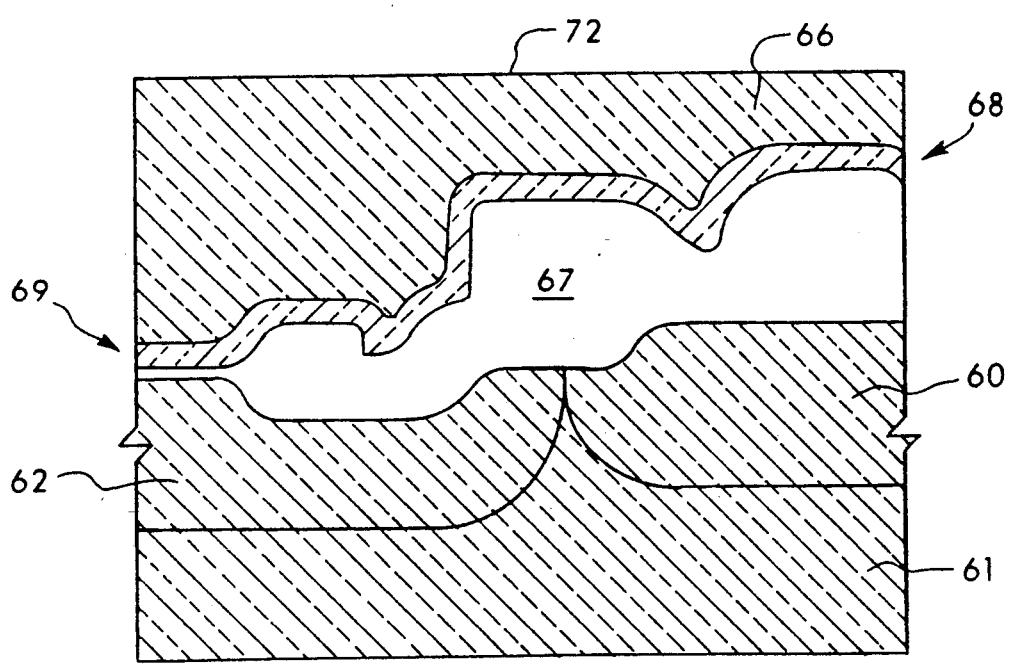
FIG. 9 is a cross-sectional view of the semiconductor wafer of FIG. 8 after planarization.

FIG. 8 shows another preferred embodiment of the invention. The figure depicts a cross-section of a portion of a DRAM in the area where a P-well 60 and an N-well 62 are adjacent. The parts or the DRAM structure shown include a preferably lightly p-doped silicon substrate 61, P-well 60, N-well 62, interlayer dielectric (ILD) TEOS layer 64, and BPSG layer 66. The structure of the DRAM in the P-well region 68 is much more complex than that in the N-well region 69. Again the structure in the area 67 and the actual structure of the doped areas in the substrate 61 is quite complex and not shown since the specific details of the structure are not relevant to the invention. The complexity of area 67 results in a significant height difference between the P-well region 68 and the N-well region 69. Again, this height difference has made producing a smooth, flat surface by the standard oxide CMP process, discussed in detail above, difficult. In the process according to the invention, a portion 70 of the BPSG layer 66 is converted to nitride by masking and nitrogen ion bombardment. This makes the removal rate in the area 70 much less than in the unaltered BPSG layer 66 during the standard oxide CMP process. The result is an smooth, flat surface 72 as shown in FIG. 9. Again, it is noted that the nitrogen implantation is designed so that the entire nitride area 70 is removed in the CMP process.

Figure 10A:
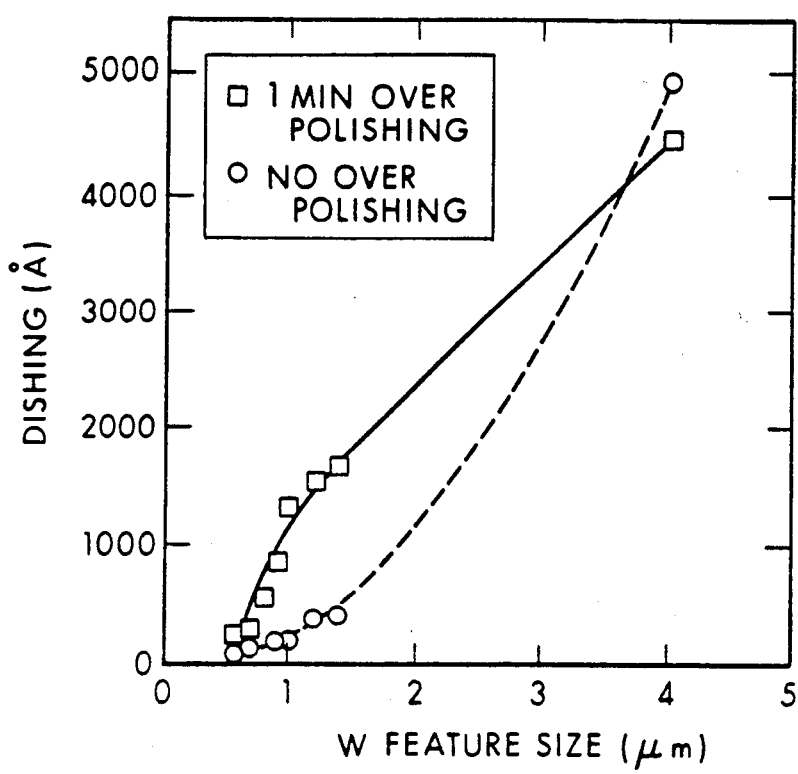
FIG. 10A is a graph of the experimentally determined dishing as a function of feature size for several different polishing conditions.
Figure 10B:
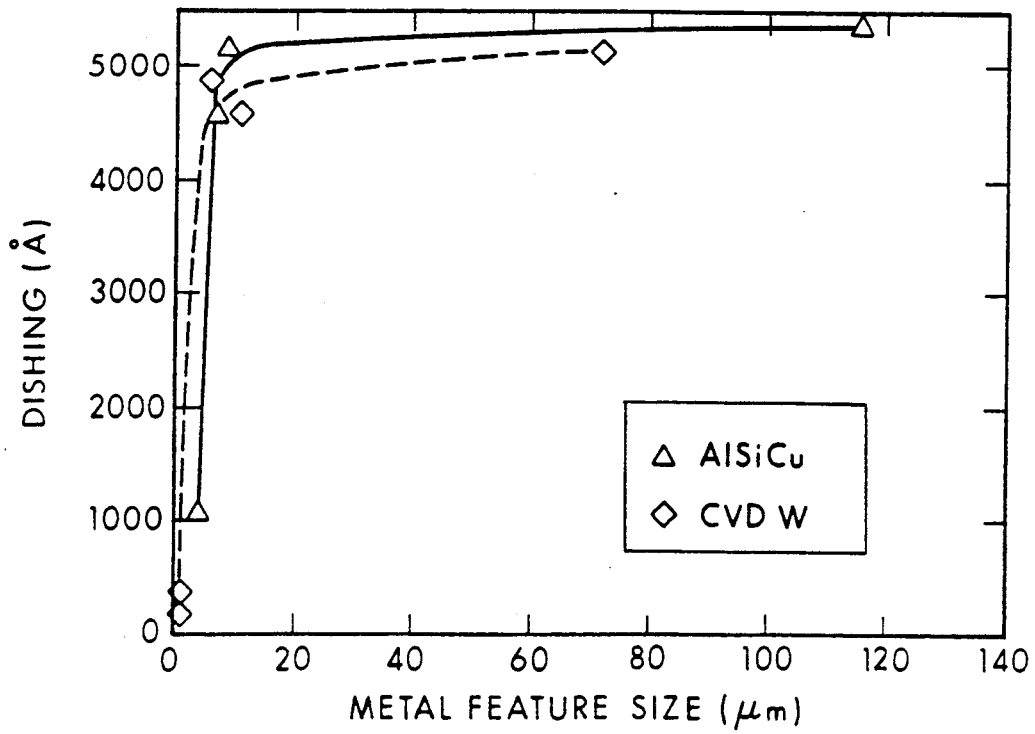
FIG. 10B is a graph of the experimentally determined dishing as a function of feature size for two different films.

The dimensions of the various layers in the embodiments of the invention described above will depend on a wide variety of factors, including the details of the particular semiconductor device designs, the particular fabrication processes used, the choice of CMP ingredients, and the desired degree of flatness desired in the final result. In the embodiment of FIGS. 2–3, the thickness of layer 14 may range from about 0.5 μm thick (the vertical direction in the figures) to about 1.5 μm thick, and nominally is about 1 μm thick. For a trough 16 that is greater than 2 μm wide (the horizontal direction in the figures) by 0.5 μm deep, the tungsten nitride portion 24 may range from 50% of the length of trough 16 to 100% of trough 16, and nominally is about 80% of the length of trough 16, and may range from about 100Å thick to about 2000Å thick, and nominally is about 1000Å thick. For the reverse mask embodiment of FIG. 4, the tungsten oxide portions 34 and 36 may range from about 1000Å thick to about 5000Å thick, and nominally is about 3000Å thick. Since the preferred dimensions of the altered portions depend on so many variables which cannot be anticipated in a document of this length, the actual dimensions chosen should be adjusted depending on the application and the experience of the user of the process. For the embodiments of FIGS. 2–4, experimental dishing curves shown in FIGS. 10A and 10B, give some guidance. FIG. 10A shows the effect of over polishing on dishing. As can be seen from the figure, dishing is negligible with no over polishing, but is significant for one minute of over polishing particularly for feature sizes of width greater than about 1 μm. FIG. 10B shows dishing as a function of feature size for a chemical vapor deposited tungsten metal film and for an AlSiCu film. The dishing is negligble for narrow features, but rises rapidly as the feature size approaches about 1 μm, and then appears to level off at a relatively high value of about 5000Å. Generally, we have found that for features less than 1 μm in width, dishing is negligible, and for features of 4 μm or larger, dishing is significant.

Figure 6:
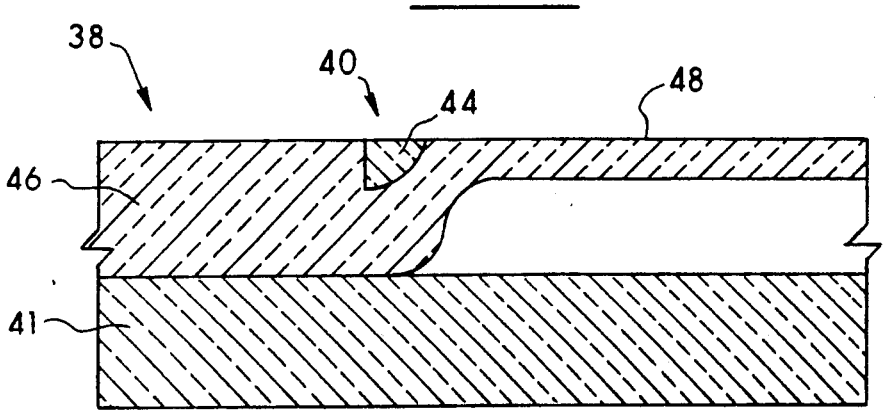
FIG. 6 is a cross-sectional view of the semiconductor wafer of FIG. 5 after planarization.
Figure 7:
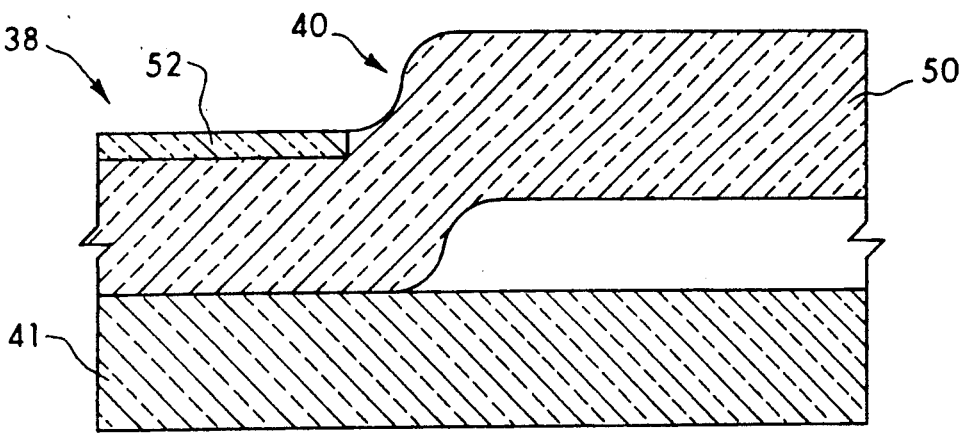
FIG. 7 is a cross-sectional view of a semiconductor wafer according to a further alternative preferred embodiment of the invention in which a portion of the surface of an oxide layer overlying the semiconducting substrate adjacent the periphery of a memory array has been altered to make it more resistant to CMP.

Turning to the embodiments of FIGS. 5–7, for a difference of about 0.5 μm to 1.5 μm in heights between the memory array 40 and the periphery 38, the thickness of implanted BPSG layer 44 in the embodiment of FIG. 5 may range from about 2000Å thick to about 7000Å thick, and nominally is about 5000Å thick. The relative dimensions for an application of the invention that involves the silicon oxides, such as the embodiment of FIGS. 5 and 6, may be found from table 1, which gives the polishing rates of the undoped and doped oxides.

TABLE I

| POLISHING RATES OF UNDOPED AND DOPED OXIDES | |
|---|---|
| Type of Oxide | Polishing Rate (KÅ/min) |
| Undoped Oxide (TEOS) | 1–2 |
| Doped Oxide (B: 2.6%; P: 5.7%) | 3–4 |

For a difference of about 0.5 μm to 1.5 μm in heights between the P-well region 68 and the N-well region 69 in the embodiment of FIGS. 8 and 9, the thickness of the nitrogen implanted layer 70 may range from about 500Å thick to about 3000 Å thick, and nominally is about 1000Å thick.

The dimensions of the other parts of the invention, such as the silicon substrate 12, the oxide 13, area 42 in FIGS. 5–7, the doped area 60 and 61 (FIGS. 8 and 9), area 67, and TEOS layer 64 are generally known by those skilled in the art.

A feature of the invention is that by using technologies readily available in the semiconductor fabrication art, the CMP process can be controlled to a significant degree to produce excellent planarization in many situations where obtaining good planarization was difficult in the prior art.

Another feature of the invention is that much of the data concerning the standard CMP processes is applicable to the present invention. That is, CMP processes have been studied for several years with the view towards optimizing the processes. For example there is much data on the relative removal rates of variations of the oxide CMP process, and their effect on materials that may be adjacent the oxide, such as nitrides. This information can now be applied to further optimizing the process of the invention.

There has been described a novel method of designing and controlling the CMP process that results in much better planarization and which has many other advantages. It should be understood that the particular embodiments shown in the drawings and described within this specification are for purposes of example and should not be construed to limit the invention which will be described in the claims below. Now that a number of examples of the method of the invention have been given, numerous other applications are evident. Nearly any prior art CMP process may be improved by the method of the invention. Further, it is evident that those skilled in the art may now make numerous uses and modifications of the specific embodiment described, without departing from the inventive concepts. Or the various parts described may be made with a wide variety of dimensions and materials. A greater or lesser number of parts may be used. Consequently, the invention is to be construed as embracing each and every novel feature and novel combination of features present in and/or possessed by the semiconductor device described.

What is claimed is:

1. A method of fabrication of an integrated circuit, said method comprising the steps of:
   providing a semiconductor wafer having a surface layer of a material to be planarized in a chemical mechanical polishing process;
   masking said surface layer to define first and second laterally adjacent portions of said surface layer;
   altering only said first portion of said surface layer of material to polish at a different removal rate in the chemical mechanical polishing process than said second portion of said surface layer; and
   polishing said surface layer in said chemical mechanical polishing process.

2. A method as in claim 1 wherein said step of altering comprises adding an impurity to said first portion of said material.

3. A method as in claim 2 wherein said step of altering comprises chemically altering said first portion of said material.

4. A method of fabrication of an integrated circuit, said method comprising the steps of:
   providing a semiconductor wafer having a surface layer of a first material to be planarized in a chemical mechanical polishing process, said first material having a first polish rate in the chemical mechanical polishing process;
   masking the surface layer to expose only a portion of the surface layer;
   altering said exposed portion of said surface layer of said first material to create a second material which has a second removal rate in the chemical mechanical polishing process different than said first material; and
   polishing said surface layer in the chemical mechanical polishing process.

5. A method as in claim 4 wherein said step of polishing comprises removing all of said second material.

6. A method of fabrication of an integrated circuit, said method comprising the steps of:
   providing a semiconductor wafer having a surface layer of a first material to be planarized in a chemical mechanical polishing process;
   altering a portion of said surface layer of material to create a second material which responds differently to the chemical mechanical polishing process than said first material wherein said step of altering comprises doping selected portions of said first material; and
   polishing said surface layer in a chemical mechanical polishing process.

7. A method as in claim 6 wherein said step of doping comprises ion implantation.

8. A method as in claim 4 wherein said first material is silicon dioxide.

9. A method as in claim 6 wherein said step of doping comprises doping with boron or phosphorous and said second material is doped silicon oxide.

10. A method as in claim 9 wherein said step of doping comprises adding between 1% and 4% Boron and between 5% and 8% phosphorus.

11. A method as in claim 6 wherein said step of doping comprises doping with nitrogen.

12. A method of fabrication of an integrated circuit, said method comprising the steps of:
    providing a semiconductor wafer having a surface layer of a first material to be planarized in a chemical mechanical polishing process, said first material having a first polish rate in the chemical mechanical polishing process;
    altering a portion of said surface layer of said first material to create a second material which has a second removal rate in the chemical mechanical polishing process different than said first material wherein said step of altering comprises the steps of:
    (i) masking said layer of material;
    (ii) exposing said masked area of material to a modification process to modify selected areas of said layer of material; and
    (iii) polishing said surface layer in the chemical mechanical polishing process.

13. A method as in claim 12 wherein said material is silicon dioxide and said modification process comprises ion implantation.

14. A method as in claim 12 wherein said first material is tungsten and said modification process comprises immersion in a plasma.

15. A method as in claim 14 wherein said second material is tungsten nitride.

16. A method as in claim 14 wherein said second material is an oxide of tungsten.

17. A method as in claim 12 wherein said first material is silicon.

18. A method as in claim 17 wherein said second material is silicon nitride.

19. A method as in claim 17 wherein said second material is an oxide of silicon.

20. A method of fabrication of an integrated circuit, said method comprising the steps of:
    providing a semiconductor wafer having a surface layer of a first material to be planarized in a chemical mechanical polishing process;
    masking the surface layer to expose only a portion of the surface layer;
    altering said exposed portion of said surface layer of material above a wafer trough to create a region of a second material more resistant to the chemical mechanical polishing process than said first material; and
    polishing said surface layer in the chemical mechanical polishing process until all of said second material is removed and said first material is planarized.

21. A method as in claim 20 wherein said first material is tungsten and said second material is tungsten nitride.

22. A method of fabrication of an integrated circuit, said method comprising the steps of:
    providing a semiconductor wafer having a surface layer of a first material to be planarized in a chemical mechanical polishing process, the surface layer having an upper surface;
    altering a portion of said surface layer of material at either side of a trough to create a region of a second material less resistant to the chemical mechanical polishing process than said first material while leaving a portion of said surface layer over said trough unaltered, wherein the upper surface includes a region of said unaltered first material and said region of said second material; and polishing said surface layer in the chemical mechanical polishing process until all of said region of second material is removed and said first material is planarized.

23. A method as in claim 22 wherein said first material is tungsten and said second material is tungsten oxide.

* * * * *